United States Patent [19]

Wolf et al.

[11] Patent Number: 5,333,141

[45] Date of Patent: Jul. 26, 1994

[54] MODULATABLE LASER DIODE FOR HIGH FREQUENCIES

[75] Inventors: Thomas Wolf; Wolfgang Thulke, both of Munich, Fed. Rep. of Germany

[73] Assignee: Siemens Aktiengesellschaft, Munich, Fed. Rep. of Germany

[21] Appl. No.: 87,322

[22] Filed: Jul. 8, 1993

[30] Foreign Application Priority Data

Jul. 8, 1992 [DE] Fed. Rep. of Germany ....... 4222466

[51] Int. Cl.$^5$ ............................ H01S 3/10; H01S 3/19
[52] U.S. Cl. ........................................ 372/20; 372/50; 372/46; 372/96
[58] Field of Search .......................... 372/50, 20, 46, 96

[56] References Cited

U.S. PATENT DOCUMENTS 5,008,893  4/1991  Amann et al. ........................ 372/50

FOREIGN PATENT DOCUMENTS 0383958  8/1990  European Pat. Off. .
0402189  6/1992  European Pat. Off. .

OTHER PUBLICATIONS

Electronics Letters, vol. 23, No. 18, Aug. 27, 1987 "High-Power, Wide-Bandwidth, 1.55 $\mu$M-Wavelength GaInAsP/InP Distributed Feedback Laser", K. Kihara et al, pp. 941-942.

Electronics Letters, vol. 26, No. 13, Jun. 21, 1990 "1.53 $\mu$m DFB Laser On Semi-Insulating InP Substrate with Very Low Threshold Current", W. Thulke et al, pp. 933-934.

"Tunable Twin-Guide Lasers with Flat Frequency Modulation Response by Quantum Confined Stark Effect", By Wolf et al, Appl. Phys. Ltr. 60, May 18, 1992, pp. 2472-2474.

"Design & Fabrication of 1.3 $\mu$m buried ridge strip lasers on semi-insulating InP substrate:", by P. Devoldere et al, IEE Proceedings, vol. 136, No. 1, Feb. 1989, pp. 76-82.

"Fabrication & lasing characteristics of $\lambda=1.56$ $\mu$m tunable twin-guide (TTG) DFB lasers" by C. F. J.' Schanen et al, IEE Proceedings, vol. 137, No. 1, Feb. 1990, pp. 69-73.

Modified 1.3 $\mu$m buried ridge stripe laser for implanted-FET integration by F. Delorme et al, IEE Proceedings, vol. 137, No. 1, Feb. 1990, pp. 39-42.

Integratable, High Speed Buried Ridge DFB Lasers Fabricated On Semi-Insulating Substrates, P. M. Charles et al, Electronics Letters, Apr. 25, 1991, vol. 27, No. 9, pp. 700-702.

Continuously Tunable Single-Frequency Laser Diode Utilizing Transverse Tuning Scheme, M. C. Amann et al, Electronics Letters vol. 25, No. 13, Jun. 22, 1989, pp. 837-839.

Primary Examiner—Georgia Y. Epps

[57] ABSTRACT

A modulatable laser diode for high frequencies, such as a tuneable turn guide distributed feedback laser diode, that has a central layer provided for a separate current supply located between a tuning layer and an active layer. The tuning layer has a quantum well structure. A ridge waveguide is provided for the laser diode and the layer sequence is limited to a strip-shaped mesa on the substrate in order to reduce the parasitic capacitances.

15 Claims, 1 Drawing Sheet

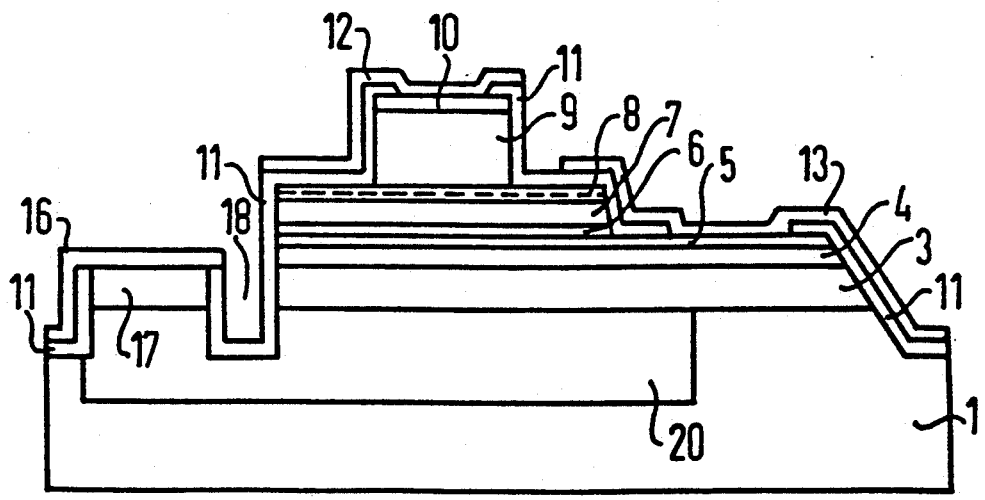

MODULATABLE LASER DIODE FOR HIGH FREQUENCIES

BACKGROUND OF THE INVENTION

The present invention is directed to a rapidly modulatable laser diode having a flat frequency curve at the modulation amplitude.

The direct frequency modulation of semiconductor lasers is a promising method for message transmission in optical communication networks that is particularly useful for coherent transmission. In its simplest form, the frequency modulation is produced by varying the laser current. This effects a variation of the charge carrier density in the active zone of the laser diode and, thus, effects a variation of the emission frequency via a change in the optical refractive index in the laser resonator. However, due to the dissipated heat involved therewith a change in the current simultaneously results in a temperature change which also influences the emission frequency. This influence is greater than that of the charge carrier and is oppositely directed. Since the temperature change is limited to frequencies below 10 MHz because of the relatively large thermal time constant, there results a dependency of the modulation amplitude on the modulation frequency whereby a minimum of the amplitude as well as a phase reversal occur at approximately 1 through 10 MHz.

In prior art modulatable laser diodes for high frequencies the refractive index is not varied by the laser current but by one or more additional currents or by utilizing the field effect instead of the injection of charge carriers. Laser modulator structures that utilize the effect of charge carrier injection are, first, the DFB laser (distributed feedback) that is multiply divided in length and, second, the TTG-DFB laser diode (tunable twin guide).

Given three-section DFB lasers, the intensities of the currents are combined in the different sections such that the disadvantageous effect of the dissipated heat is compensated. Since the charge carrier density in all three sections is varied within the laser-active layer in which the life expectancy of the charge carriers is extremely short due to the induced recombination, these three-section DFB lasers can be modulated up to frequencies far above 2.5 GHz. The considerable measurement and control outlay that is required for identifying and observing the suitable operating points of these lasers is nonetheless disadvantageous.

In the TTG-DFB laser, the frequency is modulated by charge-carrier injection into a separate tuning layer that extends over the entire laser length. Since only one current has to be varied and the laser current is fundamentally independent of the modulation, the modulation is thereby substantially simpler in technological terms than for three-section DFB lasers. The disadvantage of charge carrier injection into a separate layer is the inherent limitation of the modulation frequency to values below 500 MHz. This is caused by the life expectancy of the charge carriers that is substantially longer in the separate layer than in the active layer.

Modulation of the light due to the field effect in potential well structures (quantum confined Stark effect) is more beneficial than modulation on the basis of charge carrier injection both in view of the maximum modulation frequency as well as in view of the frequency-independent curve of the modulation amplitude. In prior art designs, the laser and the modulator layers are integrated longitudinally relative to one another. This is complicated in terms of manufacturing technology since the required potential well structures must selectively grow epitaxially outside the actual laser region. Disturbing variations in the layer thickness due to existing surface structures are thereby difficult to avoid.

Given the laser structure disclosed in the publication by T. Wolf et al., "Tunable Twin-Guide Lasers with Flat Frequency Modulation Response by Quantum Confined Stark Effect" in Appl. Phys. Lett. 60, 2472-2474 (1992), the field effect in the tuning layer of a TTG-DFB laser is utilized for frequency modulation. The tuning layer is thereby composed of a sequence of potential well layers (quantum well). Differing from conventional TTG-DFB lasers, this laser is also designed for minimum parasitic capacitances and inductances. As a result thereof, the modulation amplitude becomes frequency-independent and the maximum modulation frequency lies far above 2.5 GHz. The potential well structures are simpler to produce given transversal integration in the TTG-DFB laser than given a longitudinal integration.

SUMMARY OF THE INVENTION

It is an object of the present invention to provide an improved TTG-DFB laser diode for high frequencies, particularly above 2.5 GHz, whereby the dependency of the modulation amplitude on the modulation frequency is eliminated or at least minimized. Further, the laser should be simple to manufacture and easy to control during operation.

This object is achieved with the laser diode of the present invention. In general terms the present invention is a tunable laser diode, whereby an active layer, a tuning layer and a central layer situated therebetween are arranged transversely relative to one another with respect to the layer planes on a substrate of semi-insulating semiconductor material. Contacts are present for the separate current injection into the active layer or into the tuning layer. One of the contacts is electrically connected to the active layer, to the central layer or to the tuning layer. The tuning layer has a multi-layer quantum well layer structure and a further layer forms a ridge waveguide. A doped region is present between the recited layers and the substrate. The doped region is limited to a narrow strip under the tuning layer and the active layer. A further doped region is present on this doped region laterally relative to the tuning layer and the active layer. The contact that is electrically connected to the layer arranged between the central layer and the doped region is applied on a side of this further doped region facing away from the substrate. A trench is present that electrically insulates the further doped region from the remaining layers.

Advantageous development of the present invention are as follows.

The doped region is formed by a buffer layer embedded into the substrate.

A respective intermediate layer for matching lattice structure and doping height is provided between the tuning layer and the central layer and between the active layer and the central layer.

A doped DFB lattice layer is provided vertically adjoining the active layer.

The tuning layer is arranged on a side of the central layer facing away from the substrate.

The trench is provided with a passivation layer.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE is a cross-sectional view through the laser diode of the present invention.

DESCRIPTION OF THE PREFERRED EMBODIMENT

The basis for the laser structure of the present invention is the embodiment of a TTG-DFB laser as a ridge waveguide laser, as described in the publication by T. Wolf in Appl. Phys. Lett. The tuning diode that is formed of the tuning layer and an adjoining layer is operated in a non-conducting direction.

The single FIGURE shows a cross section through an embodiment of the laser structure of the present invention. A doped region 20 is located on a semi-insulating substrate 1. This doped region 20 is limited to a narrow strip under the tuning layer and the active layer. Given a suitable nature of the surface of the substrate 1, this doped region 20 can be produced directly in the substrate 1 by introducing doping. Instead, a doped buffer layer can form the doped region 20. Such a buffer layer reduces the effect of surface defects of the substrate 1 and allows the doping of this region to be set to a suitable height. The operational sign of the doping is selected, for example, for p-conduction. A layer sequence that has an active layer and a tuning layer is located on this doped region 20. In the exemplary embodiment to be set forth, for example, the tuning layer 3 is located on the doped region 20. This tuning layer 3 has a potential well structure that is composed of a sequence of extremely thin layers having alternately higher and lower band gap energy. This is followed by a central layer 5, which in the example shown in the FIGURE, is arranged between further contact or intermediate layers 4, 6 that serve the purpose of matching the central layer 5 to the transversely adjoining layers in terms of lattice structure and doping height. These contact or intermediate layers 4, 6 can be omitted. The following active layer 7 of the laser diode is covered with doped DFB lattice layer 8 in the example. This lattice layer 8 can be omitted. A lattice is expediently fashioned as a rifled boundary surface between the active layer 7 and the lattice layer 8. A doped ridge waveguide 9 having what is also a doped contact layer 10 is located on the lattice layer 8 in or at which the lattice indicated with a broken line is formed. The doped region 20, the ridge waveguide 9 and, potentially, the DFB lattice layer 8 are, for example, p-doped. The central layer 5 and, potentially, the contact or intermediate layers 4, 6 are, for example, n-doped. The operational signs of the dopings can also be reversed.

The current supply for the active layer 7 occurs via the ridge waveguide 9 and the contact layer 10 or, respectively, the central layer 5 with the contacts 12 and 13. The current supply for the tuning layer 3 occurs via the doped region 20 and via a further contact 16 applied thereon, in addition to occurring via the central layer 5. This further contact 16 for the tuning diode is applied on the upper side of the structure on a further doped region 17 that, for example, can be a portion of the layer structure applied for the tuning layer 3. The contacts 12, 13, 16 have the majority part of their areas on the semi-insulating substrate 1, so that the parasitic capacitances are minimum. The further doped region 17 is electrically insulated from the remaining layers, particularly from the tuning layer 3, by a shallow trench 18 and by the passivation layer 11.

The layers 3 and 7 can be interchanged in the described embodiment. In this case, the layer 3 is the active layer and the layer 7 is the tuning layer. The lattice layer 8 is either entirely lacking or is arranged neighboring the layer 3.

The advantages of the present invention result from the potential well structure of the tuning layer as well as from the strip-shaped, lateral limitation for minimizing the parasitic capacitances. The strip formed by the layers 2 through 5 is at most approximately 40 μm wide given advantageous embodiments. The sidewalls of the ridge waveguide 9, potentially the surface of the lattice layer 8 and the sidewalls of the remaining layers, particularly in the trench 18, are advantageously covered with, for example, a passivation layer 11. This passivation layer 11 is interrupted on the ridge waveguide 9, so that the contact layer 10 is in communication with the contact 12. The minimization of the parasitic capacitances results from the lateral limitation of the layers 2 through 8 and from the large spacing between the contacts.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A tunable laser diode, comprising:
   a substrate of semi-insulating semiconductor material;
   an active layer, a tuning layer and a central layer, said central layer being situated between the active and tuning layers, the active, tuning and central layers arranged on the substrate transversely relative to one another with respect to layer planes;
   contacts for separate current injection into the active layer or, respectively, into the tuning layer, said contacts being respectively electrically connected to the active layer, to the central layer and to the tuning layer;
   the tuning layer having a multi-layer quantum well layer structure;
   a further layer forming a ridge waveguide over the active layer;
   a first doped region located between the active, tuning, central further layers and the substrate, said first doped region being limited to a narrow strip under the tuning layer and the active layer;
   a second doped region on the first doped region and located laterally relative to the tuning layer and the active layer;
   the contact that is electrically connected to the layer arranged between the central layer and the first doped region being applied on a side of the second doped region opposed from the substrate; and
   a trench that electrically insulates said second doped region from at least said active, central, tuning and further layers.

2. The laser diode according to claim 1, wherein the first doped region is formed by a buffer layer embedded into the substrate.

3. The laser diode according to claim 1, wherein the laser diode further comprises a first intermediate layer for matching lattice structure and doping height located between the tuning layer and the central layer and a second intermediate layer for matching lattice structure and doping height located between the active layer and the central layer.

4. The laser diode according to claim 1, wherein the laser diode further comprises a doped distributed feedback lattice layer that is located vertically and that adjoins the active layer.

5. The laser diode according to claim 1, wherein the tuning layer is arranged on a side of the central layer opposed from the substrate.

6. The laser diode according to claim 1, wherein the trench has a passivation layer.

7. A tunable laser diode, comprising:
a substrate of semi-insulating semiconductor material;
an active layer, a tuning layer and a central layer, said central layer being situated between the active and tuning layers, the active, tuning and central layers arranged on the substrate transversely relative to one another with respect to layer planes;
a first intermediate layer for matching lattice structure and doping height located between the tuning layer and the central layer and a second intermediate layer for matching lattice structure and doping height located between the active layer and the central layer;
a plurality of contacts for separate current injection into the active layer and into the tuning layer, respective contacts of said plurality of contacts being electrically connected to the active layer, to the central layer and to the tuning layer;
the tuning layer having a multi-layer quantum well layer structure;
a further layer forming a ridge waveguide over the active layer;
a first doped region located between the active, tuning, central further layers and the substrate, said first doped region being limited to a narrow strip under the tuning layer and the active layer;
a second doped region on the first doped region and located laterally relative to the tuning layer and the active layer;
the contact that is electrically connected to at least the layer arranged between the central layer and the first doped region being applied on a side of the second doped region opposed from the substrate; and
a trench that electrically insulates said second doped region from at least the tuning layer.

8. The laser diode according to claim 7, wherein the first doped region is formed by a buffer layer embedded into the substrate.

9. The laser diode according to claim 7, wherein the laser diode further comprises a doped distributed feedback lattice layer that is located vertically and that adjoins the active layer.

10. The laser diode according to claim 7, wherein the tuning layer is arranged on a side of the central layer opposed from the substrate.

11. The laser diode according to claim 7, wherein the trench has a passivation layer.

12. A tunable laser diode, comprising:
a substrate of semi-insulating semiconductor material;
an active layer, a tuning layer and a central layer, said central layer being situated between the active and tuning layers, the active, tuning and central layers arranged on the substrate transversely relative to one another;
a first intermediate layer for matching lattice structure and doping height located between the tuning layer and the central layer and a second intermediate layer for matching lattice structure and doping height located between the active layer and the central layer;
a doped distributed feedback lattice layer that is located vertically and that adjoins the active layer;
a plurality of contacts for separate current injection into the active layer and into the tuning layer, respective contacts of said plurality of contacts being electrically connected to the active layer, to the central layer and to the tuning layer;
the tuning layer having a multi-layer quantum well layer structure;
a further layer forming a ridge waveguide over the active layer;
a first doped region located between the active, tuning, central further layers and the substrate, said first doped region being limited to a narrow strip under the tuning layer and the active layer;
a second doped region on the first doped region and located laterally relative to the tuning layer and the active layer;
the contact that is electrically connected to at least the layer arranged between the central layer and the first doped region being applied on a side of the second doped region opposed from the substrate; and
a trench that electrically insulates said second doped region from at least the tuning layer.

13. The laser diode according to claim 12, wherein the doped region is formed by a buffer layer embedded into the substrate.

14. The laser diode according to claim 12, wherein the tuning layer is arranged on a side of the central layer opposed from the substrate.

15. The laser diode according to claim 12, wherein the trench has a passivation layer.

* * * * *